United States Patent
Su

(10) Patent No.: US 9,362,878 B1
(45) Date of Patent: Jun. 7, 2016

(54) SYSTEMS AND METHODS FOR PROTECTING A SPEAKER

(71) Applicant: Cirrus Logic, Inc., Austin, TX (US)

(72) Inventor: Jie Su, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 298 days.

(21) Appl. No.: 13/756,799

(22) Filed: Feb. 1, 2013

(51) Int. Cl.
 *H03G 3/00* (2006.01)
(52) U.S. Cl.
 CPC ..................................... *H03G 3/007* (2013.01)
(58) Field of Classification Search
 CPC ...... H04R 3/007; H04R 29/00; H04R 29/001; H04R 29/003; H04R 3/002; H04R 9/06; H03F 1/52; H03G 11/00; H03G 3/20; H03G 5/16; H03G 5/165; H03G 7/00; H03G 11/04
 USPC ............................ 381/55, 58, 59, 96, 107, 108
 See application file for complete search history.

(56) References Cited

U.S. PATENT DOCUMENTS

| 2009/0268918 A1* | 10/2009 | Solgaard | H03G 9/025 381/55 |
|---|---|---|---|
| 2011/0228945 A1* | 9/2011 | Mihelich et al. | 381/59 |
| 2012/0288118 A1* | 11/2012 | Gautama | 381/98 |
| 2012/0328113 A1* | 12/2012 | Gautama | 381/55 |
| 2014/0098965 A1* | 4/2014 | Wang | H04R 29/001 381/59 |

OTHER PUBLICATIONS

Bright, Andrew, Discrete-time Loudspeaker Modelling, AES 114th Convention, Amsterdam, The Netherlands, Mar. 22-25, 2003; 25 pages.

* cited by examiner

*Primary Examiner* — Vivian Chin
*Assistant Examiner* — Jason R Kurr
(74) *Attorney, Agent, or Firm* — Jackson Walker L.L.P.

(57) ABSTRACT

In accordance with embodiments of the present disclosure, a system may include an audio speaker and a controller coupled to the audio speaker. The controller may receive a current signal indicative of an electrical current associated with the audio speaker and a voltage signal indicative of an electrical voltage associated with the audio speaker. In response to the current signal and the voltage signal, the controller may estimate modeled characteristics for the audio speaker, and based on the modeled characteristics, control an audio signal communicated from the controller to the audio speaker wherein the modeled characteristics are based on discrete-time domain information and displacement domain information and the discrete-time domain information and the displacement domain information are used to update the modeled characteristics.

27 Claims, 2 Drawing Sheets

SYSTEMS AND METHODS FOR PROTECTING A SPEAKER

FIELD OF DISCLOSURE

The present disclosure relates in general to audio speakers, and more particularly, to modeling characteristics of a speaker system in order to protect audio speakers from damage.

BACKGROUND

Audio speakers or loudspeakers are ubiquitous on many devices used by individuals, including televisions, stereo systems, computers, smart phone, and many other consumer devices. Generally speaking, an audio speaker is an electroacoustic transducer that produces sound in response to an electrical audio signal input.

Given its nature as a mechanical device, an audio speaker may be subject to damage caused by operation of the speaker, including overheating and/or overexcursion, in which physical components of the speaker are displaced too far a distance from a resting position. To prevent such damage from happening, speaker systems often include control systems capable of controlling audio gain, audio bandwidth, and/or other components of an audio signal to be communicated to an audio speaker.

However, existing approaches to speaker system control have disadvantages. For example, many such approaches model speaker operation based on measured operating characteristics, but employ linear models. Such linear models may adequately model small signal behavior, but may not sufficiently model nonlinear effects to a speaker caused by larger signals.

SUMMARY

In accordance with the teachings of the present disclosure, the disadvantages and problems associated with protecting a speaker from damage have been reduced or eliminated.

In accordance with embodiments of the present disclosure, a system may include an audio speaker and a controller coupled to the audio speaker. The controller may receive a current signal indicative of an electrical current associated with the audio speaker and a voltage signal indicative of an electrical voltage associated with the audio speaker. In response to the current signal and the voltage signal, the controller may estimate modeled characteristics for the audio speaker, and based on the modeled characteristics, control an audio signal communicated from the controller to the audio speaker wherein the modeled characteristics are based on discrete-time domain information and displacement domain information and the discrete-time domain information and the displacement domain information are used to update the modeled characteristics.

In accordance with these and other embodiments of the present disclosure, a method may include receiving a current signal indicative of an electrical current associated with an audio speaker and a voltage signal indicative of an electrical voltage associated with the audio speaker. The method may also include estimating modeled characteristics for the audio speaker in response to the current signal and the voltage signal. The method may further include controlling an audio signal communicated to the audio speaker wherein the modeled characteristics are based on discrete-time domain information and displacement domain information and the discrete-time domain information and the displacement domain information are used to update the modeled characteristics based on the modeled characteristics.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are exemplary and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
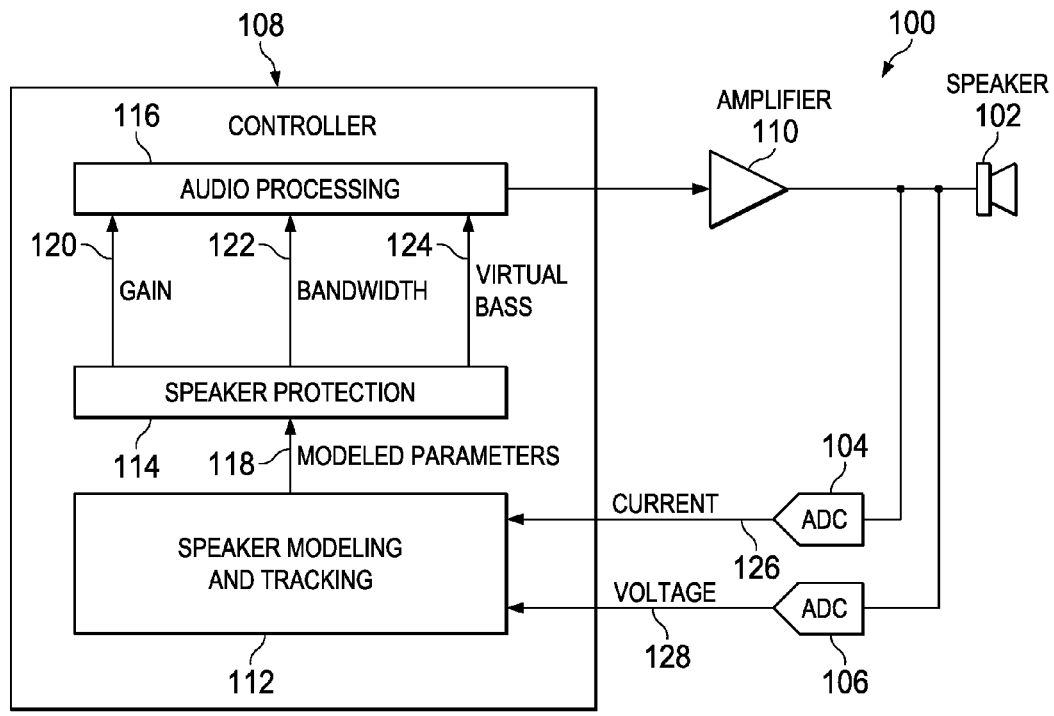
FIG. 1 illustrates a block diagram of an exemplary system that uses speaker modeling and tracking to control operation of an audio speaker, in accordance with embodiments of the present disclosure.

FIG. 1 illustrates a block diagram of an exemplary system 100 that employs a controller 108 to control the operation of an audio speaker 102, in accordance with embodiments of the present disclosure. Audio speaker 102 may comprise any suitable electroacoustic transducer that produces sound in response to an electrical audio signal input (e.g., a voltage or current signal). As shown in FIG. 1, controller 108 may generate such an electrical audio signal input, which may be further amplified by an amplifier 110. In some embodiments, one or more components of system 100 may be integral to a single integrated circuit (IC).

Controller 108 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, controller 108 may interpret and/or execute program instructions and/or process data stored in a memory (not explicitly shown) communicatively coupled to controller 108. As shown in FIG. 1, controller 108 may be configured to perform speaker modeling and tracking 112, speaker protection 114, and/or audio processing 116, as described in greater detail below.

Amplifier 110 may be any system, device, or apparatus configured to amplify a signal received from controller 108, amplify the signal by a predetermined gain, and communicate the amplified signal (e.g., to speaker 102). In some embodiments, amplifier 110 may comprise a digital amplifier configured to also convert a digital signal output from controller 108 into an analog signal to be communicated to speaker 102.

The audio signal communicated to speaker 102 may be sampled by each of an analog-to-digital converter 104 and an analog-to-digital converter 106, configured to respectively detect an analog current and an analog voltage associated with the audio signal, and convert such analog current and analog voltage measurements into digital signals 126 and 128 to be processed by controller 108.

Based on digital current signal 126 and digital voltage signal 128, controller 108 may perform speaker and modeling tracking 112 in order to generate estimated modeled parameters 118 for speaker 102, including an estimated displacement and an estimated temperature. Such modeled parameters 118 may be used to perform speaker protection 114, in which numerous controls to the audio signal for example gain 120, bandwidth 122, and virtual bass 124, may be generated and used for audio processing 116. As an example, speaker modeling and tracking 112 may indicate that a displacement of speaker 102 is greater than a predetermined maximum. In response, speaker protection 114 may control bandwidth 122 in order to filter out lower-frequency components of the audio signal which may reduce displacement of audio speaker 102, while causing virtual bass 124 to virtually add such filtered lower-frequency components to the audio signal. As another example, speaker modeling and tracking 112 may indicate that speaker 102 may be nearing an overheat condition. In response, speaker protection 114 may reduce gain 120 in order to reduce the intensity of the audio signal communicated to speaker 102.

Figure 2:
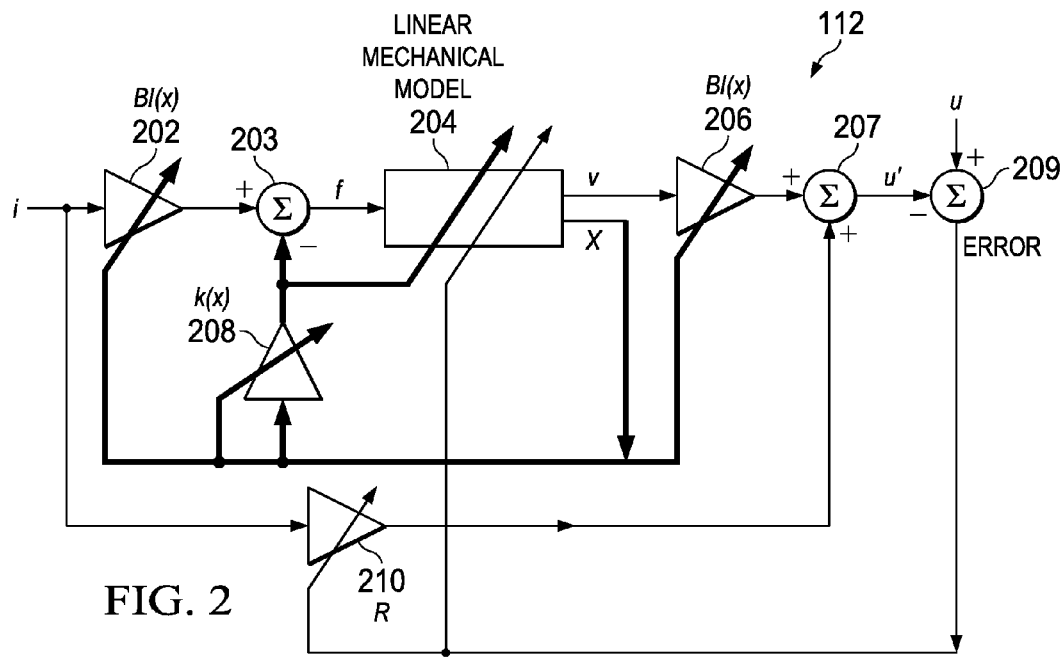
FIG. 2 illustrates a model for modeling and tracking characteristics of an audio speaker, in accordance with embodiments of the present disclosure.

FIG. 2 illustrates a more detailed block diagram of a system for modeling and tracking characteristics of audio speaker 102, in accordance with embodiments of the present disclosure. Central to speaker modeling and tracking 112 is a linear mechanical model 204, which may model displacement x and velocity v of audio speaker 102 in accordance with the equation for an ideal vibrational mechanical system:

$$f=m(d^2x/dt^2)+c(dx/dt)+kx$$

where f is the force applied to a voice coil of audio speaker 102, m is the mass of the voice coil, c is the damping factor of the voice coil, k is the stiffness of the voice coil, and x is the displacement of the voice coil.

Values for v and x generated by linear mechanical model 204 may be used as inputs to other components of speaker modeling and tracking 112 and/or to affect coefficients of the various components of speaker modeling and tracking 112, as described in greater detail below. As shown in FIG. 2, the input to linear mechanical model 204 may be an estimated force f. The estimated force f may be calculated by sum block 203 as the difference between: (i) the product of a force factor Bl(x) and a measured current i (e.g., calculated by block 202) and (ii) the product of a stiffness coefficient k(x) and the estimated displacement x. The measured current signal i may be a current sampled and converted by analog-to-digital converter 104.

In addition, an estimated voltage u' may be calculated by sum block 207 as the sum of: (i) the product of the force factor Bl(x) and the estimated velocity v (e.g., calculated by block 206) and (ii) the product of a measured current i and an electrical resistance R associated with the voice coil of audio speaker 102 (e.g., calculated by block 210). The value of error may in turn be calculated by sum block 209 as the difference between a measured voltage u and the estimated voltage u'. The measured voltage signal u may be a voltage sampled and converted by analog-to-digital converter 104.

Values for the error may be fed back into linear mechanical model 204 in order to modify one or more characteristics of linear mechanical model 204 (e.g., poles), as described in greater detail below. Values for the error may also be used to modify an estimated electrical resistance R as described in greater detail elsewhere in this disclosure. In addition, values for displacement x may be fed back to other components of speaker modeling and tracking 112, for example to update a force function Bl(x) based on displacement (e.g., at blocks 202 and 206) or to update a stiffness k(x) based on displacement (e.g., at block 208). Furthermore, the values of the stiffness k(x) may be fed into linear mechanical model 204 in order to modify one or more characteristics of linear mechanical model 204 (e.g., poles), as described in greater detail below.

Accordingly, speaker modeling and tracking 112 provides a recursive, adaptive system which attempts to converge the estimated voltage u' to a measured voltage u. In some embodiments, speaker modeling and tracking 112 may be implemented as a discrete-time system algorithm, as described in greater detail below.

To further illustrate speaker modeling and tracking 112 performed by controller 108 consider an ideal vibrational mechanical system, which, as described above, may act in accordance with the following equation:

$$f(t)=m(d^2x/dt^2)+c(dx/dt)+kx(t)$$

where t is time. Notably, the above equation reflects that that the ideal vibrational mechanical system is a second-order system.

Those of skill in the relevant art may appreciate that the LaPlace transform for the foregoing equation is:

$$f(s)=(ms^2+cs+k)x(s)$$

Those of skill in the relevant art may also appreciate that the following equation may be used to approximate a voltage u' across a speaker voice coil:

$$u'=Ri+Bl(x)v=Ri+Bl(x)(dx/dt)$$

where R is a resistance of the speaker voice coil, Bl(x) is the force function of the voice coil as a function of displacement x, and v is the velocity of the voice coil. This equation is analogous to blocks 207, 206, and 210 of FIG. 2.

Those of skill in the relevant art may further appreciate that force f on the voice coil may also be represented by the equation:

$$f(t)=Bl(x)i+[k(x)-k_0]x(t)$$

where $k_0$ is the stiffness k at a resting position. This equation is analogous to blocks 203, 202, and 208 of FIG. 2.

Also, under LaPlace transform theory:

$$x(s)/f(s)=1/(ms^2+cs+k); \text{ and}$$

$$v(s)/f(s)=s/(ms^2+cs+k)$$

These equations represent the modeling performed by linear mechanical model 204. In accordance with these equations, x(s)/f(s) and v(s)/f(s) each have poles for values of s in which $ms^2+cs+k=0$. Using the quadratic equation, such poles $\lambda_1$ and $\lambda_2$ may be given by:

$$\lambda_1,\lambda_2=[-c\pm\sqrt{(c^2-4mk)}]/2m$$

Using impulse invariance theory, the equations for x(s)/f(s) and v(s)/f(s) may be rewritten in the z domain as:

$$x(z)/f(z)=C_x z^{-1}/(1+z_1 z^{-1}+z_2 z^{-2}); \text{ and}$$

$$v(z)/f(z)=C_v(1-z^{-2})/(1+z_1 z^{-1}+z_2 z^{-2})$$

where $z_1=-(e^{T\lambda_1}+e^{T\lambda_2})$, $z_2=e^{T\lambda_1}e^{T\lambda_2}=e^{T(\lambda_1+\lambda_2)}=e^{-Tc/m}$, e is the mathematical constant referred to as Euler's number or Napier's constant, T is the inverse of the sampling frequency of the system (e.g., the sampling rate of analog-to-digital converters 104 and 106), $C_x$ and $C_v$ are matching coefficients related to displacement and velocity, respectively, that depend on an initial direct current state in order to match the z domain to the s domain. $z_1$ and $z_2$ are coefficients in the z transfer function of linear mechanical model 204. In the above equations, the value $z_2$ is a constant. From the above equations, because the stiffness k is a function of x, the various parameters $\lambda_1$, $\lambda_2$, $z_1$, $C_x$, and $C_v$ associated with linear mechanical model 204, which all depend at least in part on k, also vary with displacement x.

Converting various equations above into the discrete-time domain, a recursive, adaptive method may be performed by controller 108 in order to implement speaker modeling and tracking 112. In accordance with such method, controller 108 may receive a current signal i indicative of an electrical current associated with an audio speaker and a voltage signal v indicative of an electrical voltage associated with the audio speaker. Controller 108 may estimate modeled characteristics (e.g., displacement x, resistance R) for audio speaker 102 in response to the current signal and the voltage signal. Based on such modeled characteristics, controller 108 may control an audio signal communicated to audio speaker 102 wherein the modeled characteristics are based on discrete-time domain information and displacement domain information. Controller 108 may also use the discrete-time domain information and the displacement domain information to update the modeled characteristics in an adaptive, recursive manner.

In some embodiments, the discrete-time domain information is derived from a second-order system (e.g., a discrete-time application of linear mechanical model 204) in which a least-mean squares recursion of the second-order system may be performed. In these and other embodiments, the displacement domain information may be derived from a third- or higher-order system. For example, displacement domain information may be derived from a third- or higher-order system modeling a force factor associated with the audio speaker. Additionally or alternatively, the displacement domain information is derived from a third- or higher-order system modeling a stiffness associated with the audio speaker.

Accordingly, such recursive, adaptive method incorporates both small signal (e.g., linear) and large signal (e.g., nonlinear) behaviors of audio speaker 102. An example of such a method is discussed in detail in reference to FIG. 3, below.

Figure 3:
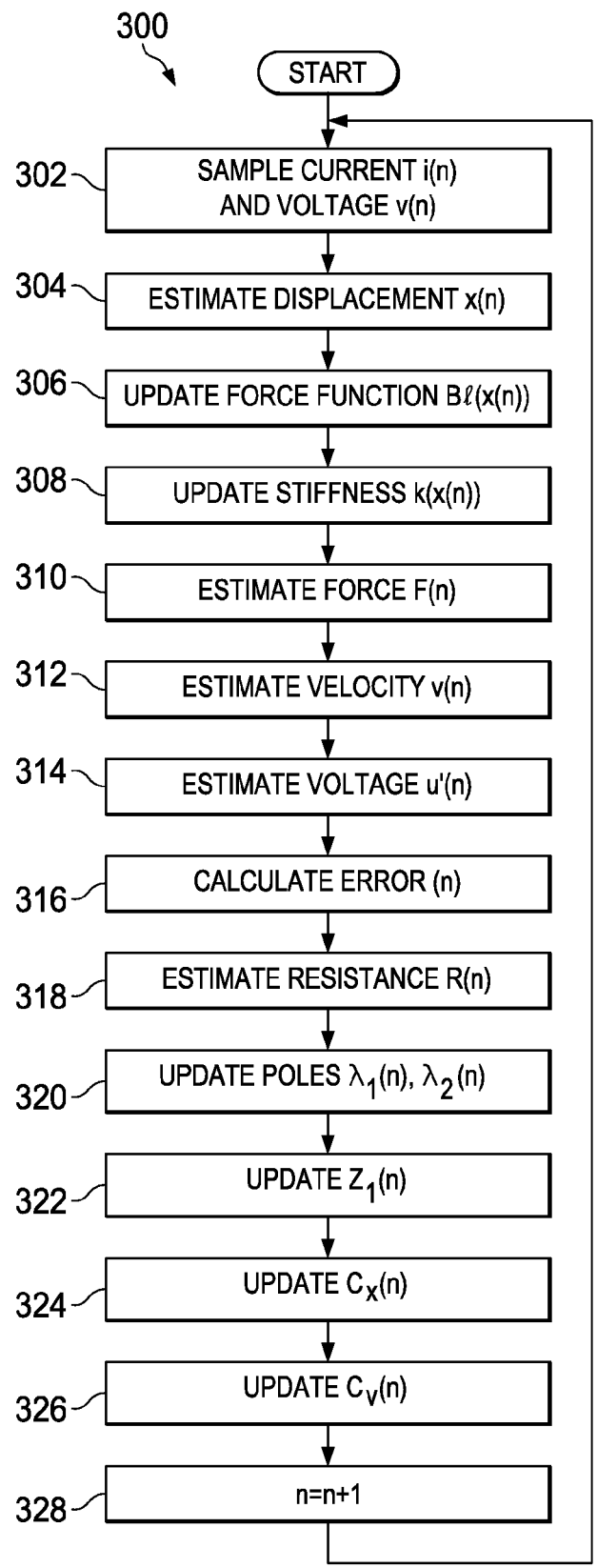
FIG. 3 illustrates a flow chart of an exemplary method for speaker modeling and tracking, in accordance with embodiments of the present disclosure.

FIG. 3 illustrates a flow chart of such an exemplary method 300 for speaker modeling and tracking 112, in accordance with embodiments of the present disclosure.

According to one embodiment, method 300 begins at step 302. Teachings of the present disclosure are implemented in a variety of configurations of IC 100. As such, the preferred initialization point for method 300 and the order of the steps comprising method 300 may depend on the implementation chosen.

At step 302, controller 108 may sample a digital current signal i(n) (e.g., current signal 126) and a digital voltage signal v(n) (e.g., voltage signal 128), representing a current through a voice coil of audio speaker 102 and a voltage across the voice coil, respectively. Such discrete-time current signal and voltage signal may be converted from an analog current sampled by analog-to-digital converter 104 and an analog voltage sampled by analog-to-digital converter 106, respectively.

At step 304, controller 108 may estimate a displacement x(n). From the z-domain equation for x(z)/f(z), above, such displacement x(n) may be written in the discrete-time domain as:

$$x(n)=C_x(n-1)f(n-1)-z_1(n-1)x(n-1)-z_2x(n-2)$$

This equation is analogous to linear mechanical model 204 depicted in FIG. 2.

At step 306, controller 108 may update a force function Bl(x(n)). As mentioned above, in some embodiments, displacement domain information may be derived from a third- or higher-order system. For example, in a fourth-order system, the force factor may be defined by the equation:

$$Bl(n)=Bl_0+Bl_1x(n)+Bl_2x^2(n)+Bl_3x^3(n)+Bl_4x^4(n)$$

where the coefficients $Bl_0$, $Bl_1$, $Bl_2$, $Bl_3$, and/or $Bl_4$ may be based on pre-manufacturing characterization of audio speaker 102 and/or similar audio speakers (e.g., based on testing equipment manufactured by Klippel GmbH). Accordingly, nonlinear effects of displacement on the force factor may be modeled.

At step 308, controller 108 may update a stiffness function k(x(n)). Again, as mentioned above, in some embodiments, displacement domain information may be derived from a third- or higher-order system. For example, in a fourth-order system, the stiffness may be defined by the equation:

$$k(n)=k_0+k_1x(n)+k_2x^2(n)+k_3x^3(n)+k_4x^4(n)$$

where the coefficients $k_0$, $k_1$, $k_2$, $k_3$, and/or $k_4$ may be based on pre-manufacturing characterization of audio speaker 102 and/or similar audio speakers (e.g., based on testing equipment manufactured by Klippel GmbH). Accordingly, nonlinear effects of displacement on the stiffness may be modeled.

At step 310, controller 108 may estimate a force f(n) upon the voice coil. From the equation for force f(x), above, such displacement f(n) may be written in the discrete-time domain as:

$$f(n)=Bl(n)i(n)+[k(n)-k_0]x(n)$$

This equation is analogous to blocks 203, 202, and 208 depicted in FIG. 2.

At step 312, controller 108 may estimate a velocity v(n) of the voice coil. From the z-domain equation for v(z)/f(z), above, such velocity v(n) may be written in the discrete-time domain as:

$$v(n)=C_v(n-1)f(n)-C_v(n-1)f(n-2)-z_1(n-1)v(n-1)-z_2v(n-2)$$

This equation is analogous to linear mechanical model 204 depicted in FIG. 2.

At step 314, controller 108 may estimate an expected voltage u'(n) across the voice coil. From the equation above for voltage u, above, such voltage u'(n) may be written in the discrete-time domain as:

$$u'(n)=R(n-1)i(n)+Bl(n)v(n)$$

This equation is analogous to blocks 207, 206, and 210 depicted in FIG. 2.

At step 316, based on such expected voltage u'(n) and an actual measured voltage u(n), controller 108 may calculate an error(n) as:

$$error(n)=u(n)-u'(n)$$

Notably, this equation is analogous to block 209 depicted in FIG. 2.

At step 318, controller 108 may estimate a resistance R(n). From above, error(n)=u(n)−u'(n)=u(n)−R(n−1)i(n)−Bl(n)v(n). Accordingly, derror(n)/dR=−i(n). Hence:

$$R(n)=R(n-1)-\mu_R \cdot error(n) \cdot derror(n)/dR = R(n-1) + \mu_R \cdot error(n) \cdot i(n)$$

Where $\mu_R$ is a step size for updating R(n).

At step 320, controller 108 may update poles $\lambda_1$ and $\lambda_2$ of the linear mechanical model 204 in accordance with the quadratic equation:

$$\lambda_1(n),\lambda_2(n)=[-c\pm\sqrt{(c^2-4mk(n))}]/2m$$

At step 322, controller 108 may update z transfer function coefficient $z_1(n)$. From the equation above for $z_1$, $z_1(n)$ may be written in the discrete-time domain as:

$$z_1(n)=-(e^{T\lambda_1(n)}+e^{T\lambda_2(n)})$$

At step 324, controller 108 may update displacement matching coefficient $C_x(n)$. By substitution in various equations set forth above, $C_x(n)$ may be written in the discrete-time domain as:

$$C_x(n)=(1+z_1(n)+z_2)/k(n)$$

At step 326, controller 108 may update velocity matching coefficient $C_v(n)$. By substitution in various equations set forth above, it may be seen that:

$$dv(n)/dCv=f(n)-f(n-2)-z_1(n-1)\cdot dv(n-1)/dC_v-z_2-dv(n-2)/dC_v$$

With further substitution, controller 108 may update $C_v(n)$ as:

$$C_v(n)=C_v(n-1)+\mu_{C_v}\cdot Bl(n)\cdot error(n)\cdot dv(n)/dC_v$$

Where $\mu_{C_v}$ is a step size for updating $C_v(n)$.

At step 328, time n may step to its next interval. After step 328, method 300 may return again to step 302, and steps 302 to 328 may be recursively repeated.

As method 300 is performed in order to implement speaker modeling and tracking 112, controller 108 may, from time to time based on modeled characteristics for resistance R(n) displacement x(n), and/or other characteristics, control gain 120, bandwidth 122, virtual bass 124, and/or other components associated with an audio signal to be communicated to audio speaker 102.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 is implemented using mobile device 102 or any other system operable to implement method 300. In certain embodiments, method 300 may be implemented partially or fully in software and/or firmware embodied in computer-readable media.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
   a controller configured to be coupled to an audio speaker, wherein the controller receives a current signal indicative of an electrical current associated with the audio speaker and a voltage signal indicative of an electrical voltage associated with the audio speaker, and in response to the current signal and the voltage signal, estimates modeled characteristics for the audio speaker, and based on the modeled characteristics, controls an audio signal communicated from the controller to the audio speaker wherein the modeled characteristics are based on discrete-time domain information and displacement domain information and the discrete-time domain information and the displacement domain information are used to update the modeled characteristics, wherein the displacement domain information is derived from a third- or higher-order system.

2. The system of claim 1, wherein the discrete-time domain information is derived from a second-order system.

3. The system of claim 1, wherein the discrete-time domain information is derived from a least-mean-squares recursion model associated with the audio speaker.

4. The system of claim 1, wherein the discrete-time information is derived from a discrete-time linear mechanical model of the audio speaker.

5. The system of claim 1, wherein the displacement domain information is derived from a third- or higher-order system modeling a force factor associated with the audio speaker.

6. The system of claim 1, wherein the displacement domain information is derived from a third- or higher-order system modeling a stiffness associated with the audio speaker.

7. The system of claim 1, wherein the controller recursively estimates the modeled characteristics by:
   (a) applying a discrete-time linear mechanical model comprising one or more parameters to an estimated force associated with the audio speaker to generate an estimated displacement and estimated velocity associated with the audio speaker;
   (b) based on the estimated velocity, a force factor, the current signal, and an estimated resistance associated with the audio speaker, estimating an expected voltage;
   (c) calculating an error based on the difference between the expected voltage and the voltage signal;
   (d) updating the estimated resistance based on the error;
   (e) updating the force factor based on the estimated displacement;
   (f) updating a stiffness associated with the audio speaker based on the estimated displacement;
   (g) modifying the one or more parameters of the discrete-time linear mechanical model based on the error and the estimated displacement;
   (h) updating the estimated force based on the force factor, the current signal, the stiffness, and the estimated displacement; and
   (i) repeating (a) through (h).

8. The system of claim 7, wherein the discrete-time linear mechanical model models an equation $f(t)=m(d^2x/dt^2)+c(dx/dt)+kx(t)$, where x(t) is the estimated displacement, f(t) is the estimated force as a function of time, k is a stiffness as a function of x, m is a mass associated with the audio speaker, and c is a damping factor associated with the audio speaker.

9. The system of claim 8, wherein the one or more parameters comprise poles of the inverse of a LaPlace transform of the equation for the discrete-time linear mechanical model.

10. The system of claim 8, wherein the one or more parameters comprise a coefficient in a z transfer function of the discrete-time linear mechanical model from a LaPlace transform of the equation for the discrete-time linear mechanical model.

11. The system of claim 8, wherein the one or more parameters comprise a displacement matching coefficient matching a z transfer function of the discrete-time linear mechanical model associated with a LaPlace transform of the equation for the discrete-time linear mechanical model.

12. The system of claim 8, wherein the one or more parameters comprise a velocity matching coefficient matching a z transfer function of the discrete-time linear mechanical model associated with a LaPlace transform of the equation for the discrete-time linear mechanical model.

13. The system of claim 1, wherein the controller is a single controller.

14. The system of claim 1, wherein the controller controls an audio signal communicated from the controller to the audio speaker by controlling at least one of a gain, a bandwidth, and a virtual bass associated with the audio signal.

15. A method comprising:
receiving a current signal indicative of an electrical current associated with an audio speaker and a voltage signal indicative of an electrical voltage associated with the audio speaker;
in response to the current signal and the voltage signal, estimating modeled characteristics for the audio speaker; and
based on the modeled characteristics, controlling an audio signal communicated to the audio speaker wherein the modeled characteristics are based on discrete-time domain information and displacement domain information and the discrete-time domain information and the displacement domain information are used to update the modeled characteristics;
wherein the displacement domain information is derived from a third- or higher-order system.

16. The method of claim 15, wherein the discrete-time domain information is derived from a second-order system.

17. The method of claim 15, wherein the discrete-time domain information is derived from a least-mean-squares recursion model associated with the audio speaker.

18. The method of claim 15, wherein the discrete-time information is derived from a discrete-time linear mechanical model of the audio speaker.

19. The method of claim 15, wherein the displacement domain information is derived from a third- or higher-order system modeling a force factor associated with the audio speaker.

20. The method of claim 15, wherein the displacement domain information is derived from a third- or higher-order system modeling a stiffness associated with the audio speaker.

21. The method of claim 15, wherein estimating modeled characteristics comprises:
(a) applying a discrete-time linear mechanical model comprising one or more parameters to an estimated force associated with the audio speaker to generate an estimated displacement and estimated velocity associated with the audio speaker;
(b) based on the estimated velocity, a force factor, a measured current signal associated with the audio speaker, and an estimated resistance associated with the audio speaker, estimating an expected voltage associated with the audio speaker;
(c) calculating an error based on the difference between the expected voltage and a measured voltage signal associated with the audio speaker;
(d) updating the estimated resistance based on the error;
(e) updating the force factor based on the estimated displacement;
(f) updating a stiffness associated with the audio speaker based on the estimated displacement;
(g) modifying the one or more parameters of the discrete-time linear mechanical model based on the error and the estimated displacement;
(h) updating the estimated force based on the force factor, the measured current signal, the stiffness, and the estimated displacement; and
(i) repeating (a) through (h).

22. The method of claim 21, wherein the discrete-time linear mechanical model models an equation $f(t)=m(d^2 x/dt^2)+c(dx/dt)+kx(t)$, where x(t) is the estimated displacement, f(t) is the estimated force as a function of time, k is a stiffness as a function of x, m is a mass associated with the audio speaker, and c is a damping factor associated with the audio speaker.

23. The method of claim 22, wherein the one or more parameters comprise poles of the inverse of a LaPlace transform of the equation for the discrete-time linear mechanical model.

24. The method of claim 22, wherein the one or more parameters comprise a coefficient in a z transfer function of the discrete-time linear mechanical model from a LaPlace transform of the equation for the discrete-time linear mechanical model.

25. The method of claim 22, wherein the one or more parameters comprise a displacement matching coefficient matching a z transfer function of the discrete-time linear mechanical model associated with a LaPlace transform of the equation for the discrete-time linear mechanical model.

26. The method of claim 22, wherein the one or more parameters comprise a velocity matching coefficient matching a z transfer function of the discrete-time linear mechanical model associated with a LaPlace transform of the equation for the discrete-time linear mechanical model.

27. The method of claim 15, wherein controlling the audio signal communicated to the audio speaker comprises controlling at least one of a gain, a bandwidth, and a virtual bass associated with the audio signal.

* * * * *